(12) United States Patent
Chen et al.

(10) Patent No.: US 9,322,852 B2
(45) Date of Patent: Apr. 26, 2016

(54) GATE DRIVE UNDER-VOLTAGE DETECTION

(71) Applicant: FORD GLOBAL TECHNOLOGIES, LLC, Dearborn, MI (US)

(72) Inventors: Lihua Chen, Northville, MI (US); Dong Cao, Canton, MI (US); Yan Zhou, Dearborn Heights, MI (US); Craig Rogers, Melvindale, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 55 days.

(21) Appl. No.: 14/331,438

(22) Filed: Jul. 15, 2014

(65) Prior Publication Data

US 2016/0018446 A1   Jan. 21, 2016

(51) Int. Cl.
| | |
|---|---|
| *H03K 17/00* | (2006.01) |
| *G01R 19/165* | (2006.01) |
| *H02M 1/32* | (2007.01) |
| *H02M 1/08* | (2006.01) |
| H02M 7/5387 | (2007.01) |
| H02M 3/158 | (2006.01) |

(52) U.S. Cl.
CPC ............. *G01R 19/1659* (2013.01); *H02M 1/08* (2013.01); *H02M 1/32* (2013.01); *H03K 17/00* (2013.01); *H02M 3/158* (2013.01); *H02M 7/53871* (2013.01)

(58) Field of Classification Search
CPC .................................................. G01R 19/1659
See application file for complete search history.

(56) References Cited

U.S. PATENT DOCUMENTS

| | | | |
|---|---|---|---|
| 4,721,869 A | 1/1988 | Okado | |
| 5,898,554 A | 4/1999 | Schnetzka et al. | |
| 5,900,683 A | 5/1999 | Rinehart et al. | |
| 6,275,093 B1 | 8/2001 | Shekhawat et al. | |
| 6,859,087 B2 | 2/2005 | Galli et al. | |
| 7,183,835 B2 * | 2/2007 | Sakata | H02H 7/0833 327/434 |
| 8,217,704 B2 | 7/2012 | Kohama et al. | |
| 2008/0272658 A1 | 11/2008 | Kojori et al. | |
| 2013/0147525 A1 | 6/2013 | Takagiwa | |

FOREIGN PATENT DOCUMENTS

| | | |
|---|---|---|
| EP | 1988633 A1 | 5/2008 |
| EP | 2688208 A1 | 1/2014 |
| JP | 2004112916 | 4/2004 |
| JP | 2012244365 | 12/2012 |

* cited by examiner

*Primary Examiner* — Hai L Nguyen
(74) *Attorney, Agent, or Firm* — David B. Kelley; MacMillan, Sobanski & Todd, LLC

(57) ABSTRACT

Gate drive faults are detected for an inverter which comprises a phase switch having an insulated gate, such as an IGBT. A complementary transistor pair is adapted to receive a supply voltage and a pulse-width modulated (PWM) signal to alternately charge and discharge the insulated gate. A comparator compares the voltage at the insulated gate with a reference voltage representing a gate drive fault to generate a first logic signal. A latch samples the first logic signal when the PWM signal has a value corresponding to charging the insulated gate. A logic circuit inhibits charging of the insulated gate when the latched logic signal indicates the gate drive fault. An insulated gate voltage less than the reference voltage is indicative of an under-voltage fault as well as other device failures of the IGBT or the complementary transistors.

10 Claims, 3 Drawing Sheets

… … …

GATE DRIVE UNDER-VOLTAGE DETECTION

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to inverter drive systems for electrified vehicles, and, more specifically, to detecting faults related to the switching operation of phase switches in an inverter.

Electric vehicles, such as hybrid electric vehicles (HEVs) and plug-in hybrid electric vehicles (PHEVs), use inverter-driven electric machines to provide traction torque and regenerative braking torque. A typical electric drive system includes a DC power source (such as a battery pack or a fuel cell) coupled by contactor switches to a variable voltage converter (VVC) to regulate a main bus voltage across a main linking capacitor. A first inverter is connected between the main bus and a traction motor to propel the vehicle. A second inverter is connected between the main bus and a generator to regenerate energy during braking to recharge the battery through the VVC. As used herein, electric machine refers to either the motor or generator.

The inverters include transistor switches (such as insulated gate bipolar transistors, or IGBTs) connected in a bridge configuration. An electronic controller turns the switches on and off in order to invert a DC voltage from the bus to an AC voltage applied to the motor, or to invert an AC voltage from the generator to a DC voltage on the bus. In each case, the inverters are controlled in response to various sensed conditions including the rotational position of the electric machine.

The inverter for the motor pulse-width modulates the DC link voltage to deliver an approximation of a sinusoidal current output to drive the motor at a desired speed and torque. PWM control signals applied to the gates of the IGBTs turn them on and off as necessary so that the resulting current matches a desired current. The IGBTs and their reverse-recovery diodes have associated switching losses which must be minimized in order to limit loss of efficiency and creation of waste heat.

One potential gate drive problem relates to having an inadequate voltage applied to the gate of an IGBT (i.e., an under-voltage fault). If the gate drive voltage is insufficient to fully saturate the IGBT when it is turned on, then the voltage drop ($v_{cc}$) and resistance across the IGBT increase, resulting in power loss and excess heat.

Conventional systems have monitored the supply voltage in an attempt to ensure that an adequate voltage is applied to the phase switches to reach saturation. It may be desirable to detect under-voltage faults, together with other types of faults, without requiring complex or expensive circuitry.

SUMMARY OF THE INVENTION

In one aspect of the invention, gate drive faults are detected for an inverter which comprises a phase switch having an insulated gate, such as an IGBT. A complementary transistor pair is adapted to receive a supply voltage and a PWM signal to alternately charge and discharge the insulated gate. A comparator compares the voltage at the insulated gate with a reference voltage representing a gate drive fault to generate a first logic signal. A latch samples the first logic signal when the PWM signal has a value corresponding to charging the insulated gate. A logic circuit inhibits charging of the insulated gate when the latched logic signal indicates the gate drive fault. An insulated gate voltage less than the reference voltage is indicative of an under-voltage fault as well as other device failures of the IGBT or the complementary transistors.

DETAILED DESCRIPTION OF PREFERRED EMBODIMENTS

Figure 1:
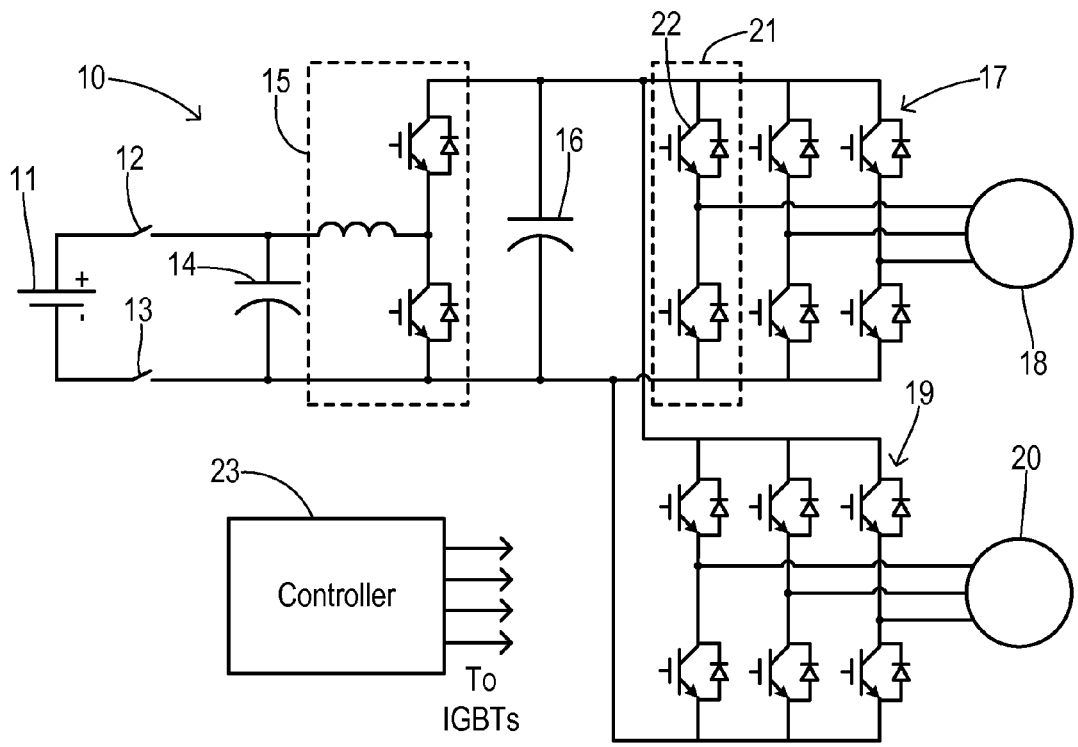
FIG. 1 is a schematic, block diagram showing one typical example of a hybrid electric vehicle with pulse-width modulated inverters.

Referring to FIG. 1, an electric vehicle drive system 10 includes a DC power source 11 (such as a battery pack or a fuel cell) coupled by contactor switches 12 and 13 to an input capacitor 14. Contactors 12 and 13 are preferably mechanical switches having an open state and a closed state for selectively coupling battery 11 to input capacitor 14 according to a driving mode of drive system 10.

A variable voltage converter (VVC) 15 couples input capacitor 14 to a main capacitor 16 which functions as a linking capacitor for converters 17 and 19, for example. Each inverter includes a plurality of switching devices in a bridge configuration. The switches in inverter 17 are switched in a desired manner to drive a motor 18. Inverter 19 is switched to regenerate energy from a generator 20 onto main capacitor 16.

Each of the phase switching devices in inverters 17 and 19 are preferably comprised of an insulated-gate bipolar transistor (IGBT). Each IGBT preferably includes anti-parallel diode. A first leg 21 of inverter 17 includes a phase switch 22, for example. Each IGBT has a respective control (i.e., gate) terminal coupled to a controller 23 which controls the switches according to various operating modes of the inverters via a PWM signal as known in the art.

Figure 2:
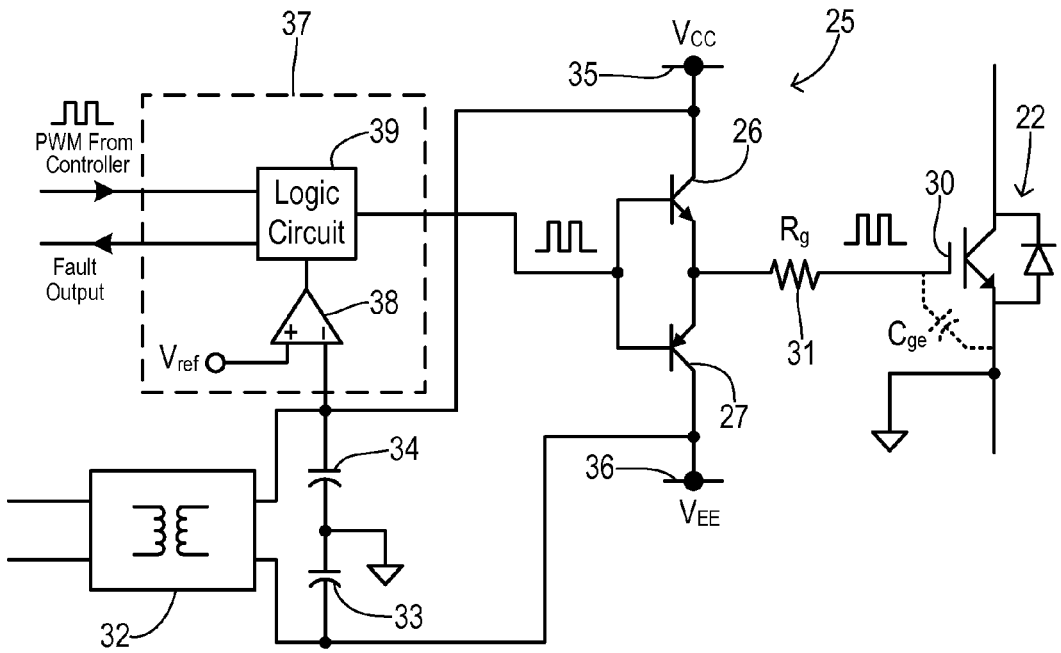
FIG. 2 is a conventional circuit topology with under-voltage detection.

FIG. 2 shows a conventional gate drive circuit 25 for IGBT 22 with under-voltage (UV) detection typically used for IGBT switching control. Gate drive circuit 25 receives a Pulse Width Modulation (PWM) signal from main controller 23 and amplifies the PWM signal by complementary-paired transistors 26 and 27 to alternately charge and discharge insulated gate 30 of IGBT 22 via a gate resistor 31, thereby turning IGBT 22 on and off according to respective charging and discharging phases of the PWM signal. Gate drive circuit 25 includes an isolated power supply comprised of a transformer 32 and capacitors 33 and 34 connected as shown to provide a $V_{CC}$ line 35 and a $V_{EE}$ line 36. The gate drive voltage is monitored indirectly by a monitoring circuit 37 which compares the supply voltage on $V_{CC}$ line 35 to a reference voltage $V_{ref}$ in a comparator 38. Supply voltage $V_{CC}$ is coupled to an inverting input of comparator 38 and $V_{ref}$ is coupled to a noninverting input. Reference voltage $V_{ref}$ is preferably set to a value about 10% less than the nominal value for the supply voltage (a typical nominal value is 15V). Whenever $V_{CC}$ falls below $V_{ref}$ then the output of comparator 38 switches from a low logic level to a high logic level. A logic circuit 39 receives the PWM signal and the output of comparator 38. If a gate drive UV fault is detected (i.e., $V_{CC}$ is below $V_{ref}$), then logic circuit 39 blocks the PWM signal in order to shut down the IGBT. In addition, logic circuit 39 generates a fault output to notify the system controller of the UV fault.

The conventional monitoring circuit shown in FIG. 2 cannot directly monitor the gate turn-on voltage of IGBT 22. Unexpected voltage drops between $V_{CC}$ line 35 and insulated gate 30 can still create a UV fault which goes undetected. Moreover, any other gate drive malfunctions or failures of the gate drive devices such as complementary transistor pair 26/27, resistor 31, or IGBT 22 itself cannot be detected. For example, an insulation fault of gate 30 could reduce gate capacitance $C_{ge}$ and reduce gate-to-emitter resistance $R_{ge}$ (FIG. 3), resulting in a lower conductance and a higher $V_{cc(sat)}$ for IGBT 22 which goes undetected.

Figure 3:
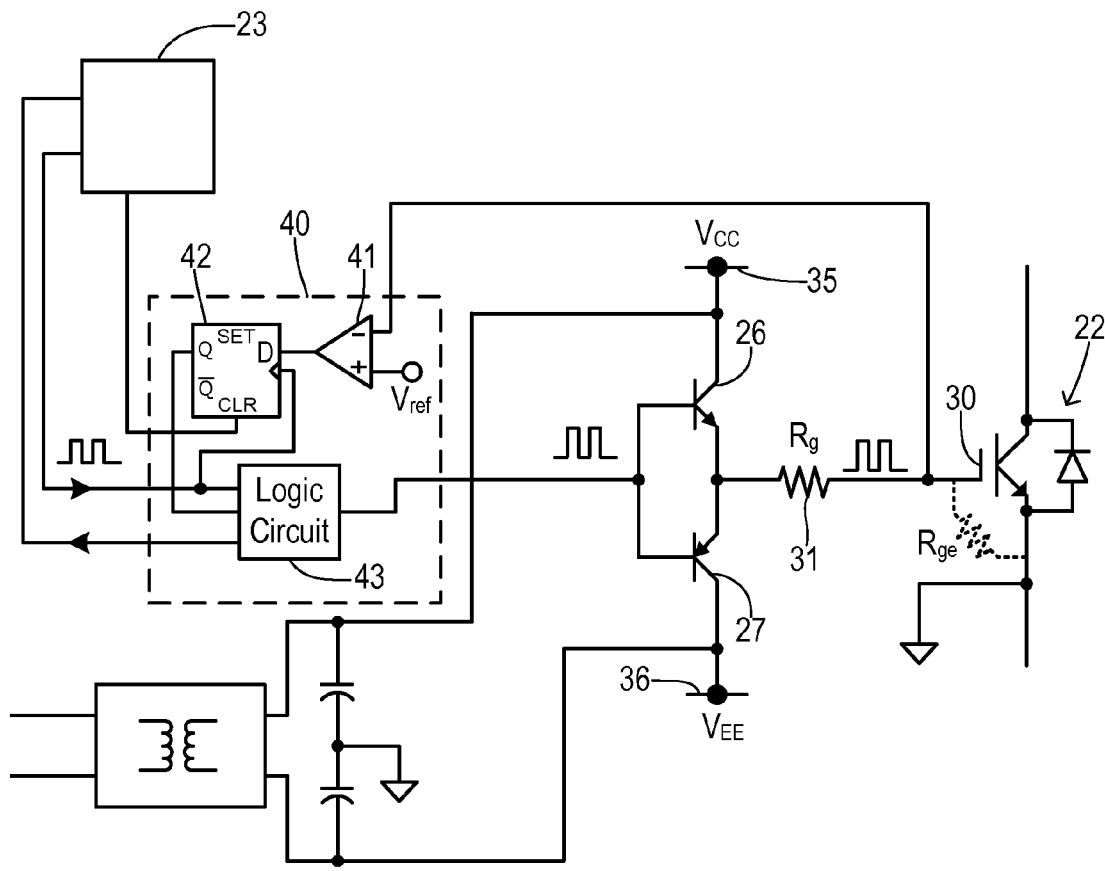
FIG. 3 is shows a circuit according to one embodiment of the present invention for detecting gate drive faults.

A first embodiment of the invention for dynamically and directly detecting IGBT on-state gate voltage is shown in FIG. 3. The gate drive circuit is identical to FIG. 2. An improved monitoring circuit 40 includes a comparator 41 having a noninverting input receiving reference voltage $V_{ref}$ and an inverting input coupled directly to insulated gate 30. Reference voltage $V_{ref}$ is again set to about 90% of the target or nominal value for $V_{CC}$. The output of comparator 41 is coupled to a latching input of a D-type flip-flop latch 42. An output Q of flip-flop 42 is coupled to a logic circuit 43. A trigger or clock input of flip-flop 42 is connected to receive the PWM signal from controller 23.

Flip-flop latch 42 is arranged to be triggered by a falling edge of the PWM signal. Thus, the logic-level output of comparator 41 (i.e., the result of the comparison between the insulated gate voltage and reference voltage $V_{ref}$) is sampled and held at the Q output at a time when IGBT 22 is still in the fully on state (since gate 30 is in a charged condition having just been charged by complementary transistor 26 during the charging phase of the PWM signal). Assuming supply voltage $V_{CC}$ is sufficiently close to its nominal level and there are no other malfunctions in the drive circuit (e.g., conduction faults in complementary transistors 26 and 27 or other device failures of transistors 26 or 27 or IGBT 22), then the gate voltage at gate 30 will be sufficiently high at the falling edge of the PWM signal to ensure a low logical output from comparator 41. Otherwise, a high logic level from comparator 41 will be latched. Whichever logic level becomes latched by flip-flop 42 is provided to logic circuit 43 as a latched logic signal indicative of the presence or absence of a gate drive fault. Logic circuit 43 inhibits charging of gate 30 in the event that a high logic level output is received from the Q output of flip-flop 42.

Figure 4:
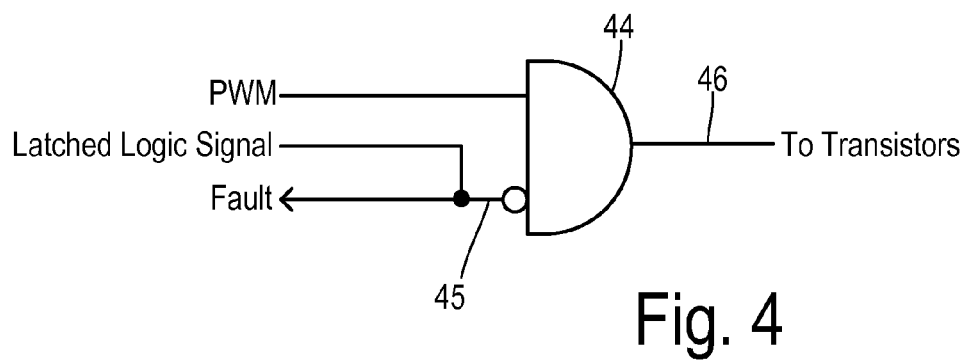
FIG. 4 shows a logic circuit in greater detail.

FIG. 4 shows one embodiment of logic circuit 43 in greater detail. An AND-gate 44 is connected to operate as a transmission gate for the PWM signal. The latched logic signal from the flip-flop latched output Q is provided to an inverting input of AND-gate 44. If the latched logic signal has a low logic level (e.g., zero volts), then the PWM signal is passed through AND-gate 44 to output line 46 and then on to the complementary transistor pair. When the latched logic signal has a high logic level (e.g., 5 volts), AND-gate 44 inhibits the PWM signal from propagating to output 46. The latched logic signal also provides a fault indication signal to the main controller to indicate that a drive fault has been detected and that the corresponding phase switch has been disabled. As shown in FIG. 3, controller 23 can include a connection to the CLR input of flip-flop 42 so that the controller can reset flip-flop 42 whenever it needs to reestablish operation of IGBT phase switch 22 (e.g., after a fault is corrected or otherwise cleared).

Figure 5:
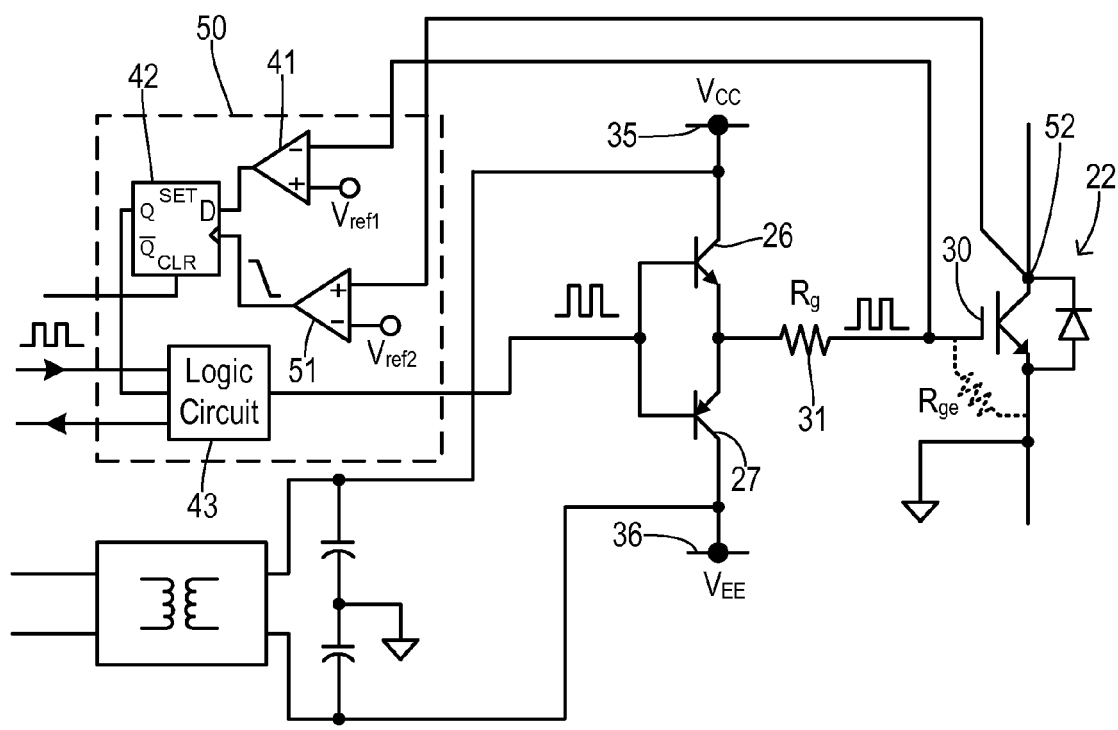
FIG. 5 is shows a circuit according to a second embodiment of the present invention for detecting gate drive faults.

FIG. 5 shows an alternative embodiment wherein a monitoring circuit 50 has been modified to trigger the latching of the flip-flop based on the state of the IGBT instead of using the PWM signal. Comparator 41 and logic circuit 43 operate in the same manner as discussed in connection with FIG. 3. In FIG. 5, the collector-emitter voltage $V_{CE}$ is used to detect the existence of the On state of IGBT 22. Accordingly, monitoring circuit 50 includes a second comparator 51 having its noninverting input coupled to collector terminal 52 of IGBT 22 and its inverting input coupled to a second reference voltage $V_{ref2}$. During a normal off-to-on transition of IGBT 22, $V_{CE}$ drops from a DC bus voltage (e.g., about 400 V) to the on-state saturation voltage (e.g., about 1.5 V). Second reference voltage $V_{ref2}$ is preferably set to a value greater than the normally expected saturation voltage (e.g., setting $V_{ref2}$ to about 5 V). Thus, when IGBT 22 turns on and the collector-emitter voltage drops below $V_{ref2}$, the output of flip-flop 42 is latched with the corresponding logic signal indicative of whether the gate voltage is at an adequate level for proper turning on of IGBT 22.

The foregoing invention directly and dynamically monitors actual On state gate voltage of the IGBT to provide under-voltage fault detection. In addition, other gate drive component failures can be detected. Therefore, catastrophic drive failures and loss of efficiency can be avoided in electric vehicle applications. A low cost and a low parts count are achieved by virtue of the invention which samples the insulated gate voltage once per switching event and latches the result of a comparison between the gate voltage and a reference voltage. The sampling time occurs at a time when the gate voltage would under normal conditions be expected to have a value corresponding to a fully turned on phase switch (e.g., determined according to the PWM signal or in response to the collector voltage).

What is claimed is:

1. An inverter comprising:
   a phase switch having an insulated gate;
   a complementary transistor pair adapted to receive a supply voltage and a PWM signal to alternately charge and discharge the insulated gate;
   a comparator comparing a voltage at the insulated gate with a reference voltage representing a gate drive fault to generate a first logic signal;
   a latch sampling the first logic signal when the PWM signal has a value corresponding to charging the insulated gate;
   a logic circuit inhibiting charging of the insulated gate when the latched logic signal indicates the gate drive fault; and
   a second comparator for comparing a voltage across the phase switch to a second reference voltage indicative of an On state of the phase switch, wherein the latch is triggered by the second comparator when the on state is detected.

2. The inverter of claim 1 wherein the gate drive fault is an under-voltage fault of the supply voltage.

3. The inverter of claim 2 wherein the reference voltage is configured to indicate the under-voltage fault whenever the supply voltage is less than 90% of a target value.

4. The inverter of claim 1 wherein the gate drive fault includes an insulation fault of the insulated gate and a conduction fault of the complementary transistor pair.

5. The inverter of claim 1 wherein the latch is triggered by a falling edge of the PWM signal.

6. The inverter of claim 1 wherein the latch is comprised of a D-type flip-flop.

7. A method of detecting a gate drive fault of an insulated gate phase switch in an inverter of an electrified vehicle, comprising:
- coupling a PWM signal to a complementary transistor pair to alternately charge and discharge the insulated gate of the phase switch during charge and discharge phases of the PWM signal, respectively;
- comparing a voltage at the insulated gate to a reference voltage representing a gate drive fault to generate a first logic signal;
- latching the first logic signal once during the charge phase of the PWM signal;
- inhibiting the charging of the insulated gate after the latched logic signal indicates the gate drive fault; and
- comparing a voltage across the phase switch to a second reference voltage indicative of an on state of the phase switch, wherein the latching step is triggered by the second comparator when the on state is detected.

8. The method of claim 7 wherein the gate drive fault is an under-voltage fault of the supply voltage, and wherein the reference voltage is configured to indicate the under-voltage fault whenever the supply voltage is less than 90% of a target value.

9. The method of claim 7 wherein the gate drive fault includes an insulation fault of the insulated gate and a conduction fault of the complementary transistor pair.

10. The method of claim 7 wherein the latching step is triggered by a falling edge of the PWM signal.

* * * * *